United States Patent [19]

Veranth

[11] 3,822,408

[45] July 2, 1974

[54] OPERATIONAL AMPLIFIER CLAMPING

[75] Inventor: Joseph L. Veranth, Marlboro, Mass.

[73] Assignee: Bose Corporation, Framingham, Mass.

[22] Filed: Feb. 20, 1973

[21] Appl. No.: 333,976

[52] U.S. Cl. .................... 330/99, 307/237, 330/110

[51] Int. Cl. .............................................. H03f 1/36

[58] Field of Search ................. 330/28, 98, 99, 110; 307/230, 237

[56] References Cited

UNITED STATES PATENTS

| | | | |
|---|---|---|---|
| 3,112,449 | 11/1963 | Miller | 307/237 X |
| 3,535,650 | 10/1970 | Doniger | 330/98 X |
| 3,636,463 | 1/1972 | Ongkiehong | 330/110 X |

OTHER PUBLICATIONS

Handbook of Operational Amplifier Applications, copyright 1963 page 55.

*Primary Examiner*—Herman Karl Saalbach
*Assistant Examiner*—James B. Mullins
*Attorney, Agent, or Firm*—Charles Hieken, Esq.; Jerry Cohen, Esq.

[57] ABSTRACT

In an amplifier having a number of stages with feedback from the output to the input, the input stage is clamped at a level slightly beyond the point where the output level is clipped independent of the clipping level or extent of phase shift in the output stage to reduce the time for overload recovery.

5 Claims, 1 Drawing Figure

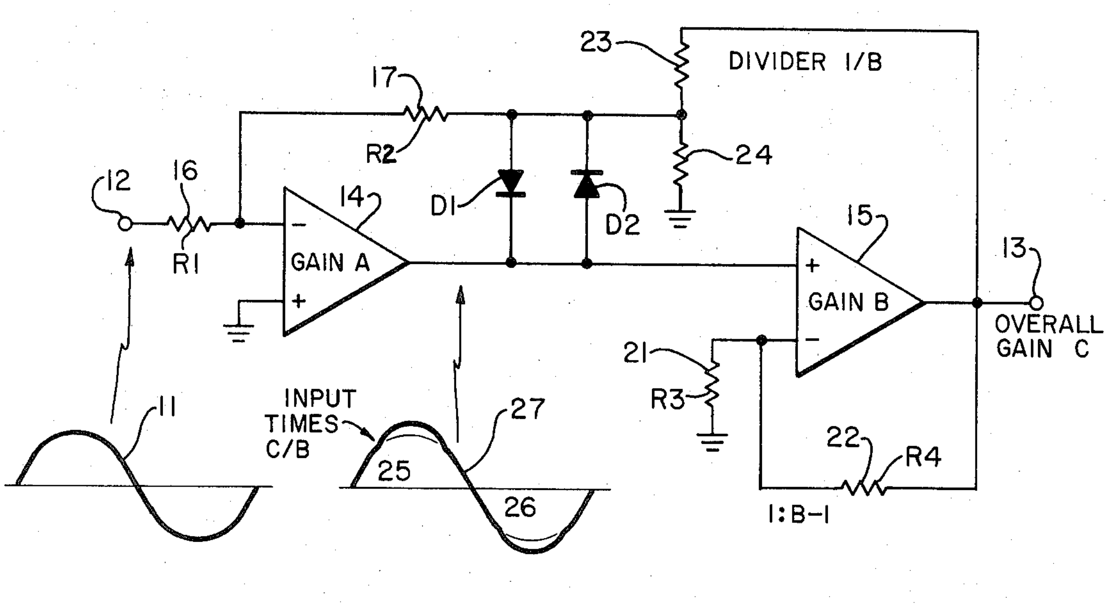
23
DIVIDER 1/B
17
R2
24
12
16
14
D1
D2
15
R1
GAIN A
13
GAIN B
OVERALL
GAIN C
21
R3
INPUT
TIMES
C/B
11
27
25
22
R4
26
1:B-1

OPERATIONAL AMPLIFIER CLAMPING

BACKGROUND OF THE INVENTION

The present invention relates in general to amplifying and more particularly concerns novel apparatus and techniques for expediting overload recovery.

When an amplifier comprises a number of cascaded stages with feedback from output to input, the earlier stages are driven to clipping when the output stage clips. The time required for the input stage(s) to return to the active amplification region results in an undesirable delay in recovery of the amplifier from overload. One prior art approach to the problem is to clamp the output of the input stage with Zener diodes either to ground or the potential on the inverting input to reduce swing. This technique doesn't allow for variations in clipping level, so the Zener voltage must be large enough for the highest clipping level. The technique also doesn't allow for phase shift in output stage(s). These two problems both cause the input stage to be limited at a value beyond what is required. This results in excess recovery time while the input stage returns to the active region.

Accordingly, it is an important object of this invention to solve the recovery delay problem described above without the disadvantages of the typical prior art solution.

It is still a further object of the invention to achieve one or more of the preceding objects with reliable relatively inexpensive apparatus.

SUMMARY OF THE INVENTION

According to the invention, means are provided for clamping the output of a preceding amplifier stage to a level slightly beyond the point where the output of a following stage is clipped. Typically this is accomplished by attenuating means coupled to the output of the following stage for attenuating the output by an amount corresponding substantially to the gain of the following stage and providing this attenuated signal as the clamping level to the output of the preceding stage. Preferably means define a feedback path from the output of the following stage to the input of the preceding stage through the attenuating means.

Numerous other features, objects and advantages of the invention will become apparent from the following specification when read in connection with the accompanying drawing in which

BRIEF DESCRIPTION OF THE DRAWING

The single FIGURE is a circuit diagram of an exemplary embodiment of the invention with graphical representations of waveforms at the input and the output of the first stage to facilitate understanding the principles of operation.

DETAILED DESCRIPTION OF PREFERRED EMBODIMENTS

With reference now to the drawing, there is shown a schematic circuit diagram of an exemplary embodiment of the invention. An input signal, such as waveform 11 is applied to input terminal 12 and provided on output terminal 13 amplified by a gain factor C after passing through input or preceding stage 14 having a gain A and output or following stage 15 having a gain B (perhaps controlled by feedback). Input stage 14 comprises a differential amplifier, such as a type N5556 integrated circuit having the + input grounded and the − input connected to input terminal 12 by series resistance 16 of value $R_1$. The output of amplifying stage 14 is coupled to the − input by clamping diodes D1 and D2 and feedback resistance 17 of value $R_2$ so that the gain A of this stage is substantially $R_2/R_1$ when the diodes are conducting.

Output amplification stage 15 consists of a balanced input power amplifier of conventional design having its + input connected to the output of input stage 14 and its − input connected to ground through resistor 21 of value $R_3$. The output of power amplifier 15 is connected to the − input by resistance 22 of value $R_4$ with the ratio $R_4$:$R_3$ corresponding to B − 1:1 where B is the gain of output stage 15. An attenuating means or voltage divider comprising resistors 23 and 24 is connected to the output of output stage 15 to divide the output signal on terminal 13 to a level across resistor 24 of 1/B of the output signal on output terminal 13. The result is that the clamping potential at the junction between resistors 23 and 24 is normally the input signal 11 times C/B and can never exceed C/B of the input potential (plus the diode drop) when output clipping occurs. The result is that the output waveform 27 of the input stage 14 is always clamped at a level slightly beyond the point where the output is clipped when clipping occurs, independent of the output stage clipping level or how much phase shift characterizes the output stage 15. The peaks of waveform 27 extend only slightly beyond the peaks 25 and 26 of a sine wave. When overloading ends, input stage 14 rapidly returns to linear operation so that amplifier recovery from overload is rapidly corrected. Furthmore, the angle of output clipping is reduced with the invention.

Diodes D1 and D2 are preferably high speed clipping diodes, such as 1N4148 diodes, and preferably have a conducting impedance that is small compared to the resistance value $R_2$.

$R_1$ = 100K
$R_2$ = 100K
$R_3$ = 340
$R_4$ = 10K
Divider resistor 23 = 10K
Divider resistor 24 = 340

There has been described inexpensive apparatus and techniques for effecting a marked reduction in the time for an amplifier to recover from overload. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Operational amplifier clamping apparatus comprising, means defining a first operational amplification stage having first amplifying means with at least a first initial input and an initial output with feedback means intercoupling said first input and said output, output power amplifying means having at least a first final input coupled to said initial output and a final output, attenuating means coupled to the latter output for providing an attenuated signal corresponding to the signal on said final output attenuated by a factor B corresponding to the gain of said output power amplifying means, said feedback means comprising means for coupling said attenuated signal to said first initial input, and clamping means for clamping said attenuated signal to said initial output.

2. Operational amplifier clamping apparatus in accordance with claim 1 wherein said output power amplifying means comprises balanced amplifying means having a second final input and further comprising a common terminal maintained at reference potential, first resistive means intercoupling said final output and said second final input, and second resistive means intercoupling said second final input and said common terminal, the ratio of the resistance of said first resistive means to that of said second resistive means being $B - 1:1$ where B is the gain of said output power amplifying means.

3. Operational amplifier clamping apparatus in accordance with claim 2 wherein said first amplifying means comprises balanced amplifying means having a second initial input connected to said common terminal and said feedback means comprises third resistive means intercoupling said first initial input and said initial output and further comprising, fourth resistive means connected to said first initial input for receiving an input signal.

4. Operational amplifier clamping apparatus in accordance with claim 2 wherein said attenuating means comprises fifth resistive means intercoupling said final output and said third resistive means, and sixth resistive means intercoupling said third resistive means and said common terminal, the ratio of the resistance of said fifth resistive means to that of said sixth resistive means being substantially $B - 1:1$.

5. Operational amplifier clamping apparatus in accordance with claim 4 wherein said clamping means comprises first and second oppositely poled unilaterally conductive devices connected in parallel between said initial output and the junction of said fifth and sixth resistive means.

* * * * *